(12) United States Patent
Wibben (10) Patent No.: US 8,816,519 B2
(45) Date of Patent: Aug. 26, 2014

(54) BLADE ANGLE ADJUSTMENT DRIVE FOR A WIND POWER PLANT

(75) Inventor: Norbert Wibben, Salzbergen (DE)

(73) Assignee: SSB Wind Systems GmbH & Co. KG, Salzbergen (DE)

( * ) Notice: Subject to any disclaimer, the term of this patent is extended or adjusted under 35 U.S.C. 154(b) by 20 days.

(21) Appl. No.: 13/264,437

(22) PCT Filed: Jan. 25, 2010

(86) PCT No.: PCT/EP2010/050812
§ 371 (c)(1),
(2), (4) Date: Oct. 14, 2011

(87) PCT Pub. No.: WO2010/118898
PCT Pub. Date: Oct. 21, 2010

(65) Prior Publication Data
US 2012/0032442 A1 Feb. 9, 2012

(30) Foreign Application Priority Data
Apr. 16, 2009 (DE) .......................... 10 2009 003 788

(51) Int. Cl.
*H02P 9/04* (2006.01)

(52) U.S. Cl.
USPC ........................................................ 290/44

(58) Field of Classification Search
USPC .................................................. 290/44, 55
See application file for complete search history.

(56) References Cited

U.S. PATENT DOCUMENTS

| | | | | |
|---|---|---|---|---|
| 4,160,170 A | * | 7/1979 | Harner et al. | 290/44 |
| 7,956,482 B2 | * | 6/2011 | Nies et al. | 290/55 |
| 8,154,235 B2 | | 4/2012 | Kestermann et al. | |
| 2008/0277938 A1 | * | 11/2008 | Oohara et al. | 290/44 |
| 2009/0001726 A1 | * | 1/2009 | Warfen et al. | 290/44 |
| 2009/0160252 A1 | * | 6/2009 | Kojima et al. | 307/24 |
| 2012/0032627 A1 | | 2/2012 | Kestermann et al. | |

FOREIGN PATENT DOCUMENTS

| | | |
|---|---|---|
| DE | 20 2005 0120 U1 | 11/2005 |
| DE | 10 2006 0091 A1 | 9/2007 |
| DE | 102007021632 A1 | 11/2008 |
| DE | 102009003691 A1 | 9/2010 |

OTHER PUBLICATIONS

International Search Report (in German with English Translation) and Written Opinion (in German) for PCT/EP2010/050812, mailed Feb. 7, 2011; ISA;EP.

English Translation of the International Preliminary Report on Patentability (Chapter I of the Patent Cooperation Treaty) for PCT/EP2010/050812, issued Oct. 18, 2011.

* cited by examiner

*Primary Examiner* — Tulsidas C Patel
*Assistant Examiner* — Sean Gugger
(74) *Attorney, Agent, or Firm* — Harness, Dickey & Pierce, P.L.C.

(57) ABSTRACT

A blade angle adjustment drive for a wind power plant having an electrical converter, an electric motor electrically coupled to the converter, and a monitoring unit which monitors the operation of the converter and identifies a malfunction in the operation of the converter. The operation of the converter may be interrupted at least temporarily based on the malfunction. An interruption prevention unit is selectively operable to prevent an interruption in the operation of the converter by the monitoring unit when the bade angle adjustment drive is in an emergency operation state.

16 Claims, 5 Drawing Sheets

BLADE ANGLE ADJUSTMENT DRIVE FOR A WIND POWER PLANT

CROSS-REFERENCE TO RELATED APPLICATIONS

This application is a 371 U.S. National Stage of International Application No. PCT/EP2010/050812, filed Jan. 25, 2010, and claims priority to German patent application No. 10 2009 003 788.8 filed Apr. 16, 2009, the disclosures of which are herein incorporated by reference in their entirety.

The invention relates to a blade angle adjustment drive for a wind power plant, comprising at least one electrical converter, at least one electric motor which is electrically coupled to the converter and which is, or can be powered by the converter, and at least one monitoring unit which monitors the operation of the converter and by which one or a plurality of malfunctions in the operation of the converter are, or can be identified and, subject thereto, the operation of the converter is, or can be, interrupted at least temporarily. The invention also relates to a method for controlling a converter of a blade angle adjustment drive for a wind power plant.

DE 20 2005 012 040 U1 discloses an electric device for adjusting rotor blades with a constant-current source with voltage limitation for simultaneously powering an inverter and an intermediate circuit unit, whereby either a battery storage, consisting of an uncoupling member and a battery, or an intermediate circuit capacitor is used. The current-voltage characteristic of the constant-current source is adjusted by voltage limitation such that the intermediate circuit unit is only loaded if the network is disrupted or if there are short-term high loads of the motor and it operates as a drain for electrical energy fed back from the rotor to the wind turbine.

DE 10 2006 009 127 A1 describes a wind turbine comprising a rotor with rotor blades, the pitch of which can be varied by a pitch adjustment device, a servomotor connected to a pitch circuit and to an emergency circuit being provided for adjustment purpose, whereby during normal operation, the rotor blades are operated by the pitch circuit and during emergency operation, they are operated by the emergency circuit, and the emergency circuit comprises an electrical energy storage, a switching means, connection lines to the servomotor and a protection means. The protection means comprises a power-flow detector module which is configured to determine whether electrical power is flowing into or out of the servomotor, and also comprises a discharging module configured to limit voltage and/or current in the emergency circuit when power flows out of the servomotor.

In wind power plants, drives with converters are used as pitch drive systems to control the rotor blade position. In this respect, the drive systems can be configured based on direct current, consisting of d.c. converter and d.c. motor (series wound machine, shunt wound machine or double-wound machine) or based on alternating current, consisting of frequency converter (with or without vector-orientated control) and three-phase machine (asynchronous machine or synchronous machine). To bridge fluctuations in voltage or transient voltage drops, in the case of self-commutated converters with a d.c. intermediate circuit, a battery or capacitor is coupled on the intermediate circuit by diodes. Thus, for these situations, the required energy can be taken from the batteries.

In order not to exceed the maximum permissible current of the converters, the ongoing current is monitored. The permissible current limit of the converters is particularly configured in that a dynamic peak current is allowed for a defined period of time, after which it is reduced to a nominal current which is smaller than the peak current.

Integrated into the converters are different monitoring functions which ensure the operativeness of the converter. Conventional monitoring functions are used, for example for monitoring the actual speed value of the electric motor, for checking the output transistors of the converter for overload (output short circuit, earth fault), for checking the mains supplying the converter for a mains phase failure (error message after a time which can be set), for monitoring the intermediate circuit voltage of the converter (intermediate circuit voltage too high, too low or with an additional comparison threshold), for monitoring the electronics supply, for checking the braking resistance for overload, for monitoring the cooling body temperature, for checking the speed for overspeed, for checking the converter for an open output, for monitoring a CPU program running in the converter, for monitoring the communication (only if this is used for control purposes: serial interface, CAN bus, options module), for monitoring the motor temperature and motor overload as well as in d.c. systems in addition to monitoring the field current. These monitoring procedures can be adapted and also partly activated and/or deactivated.

When d.c. drives are used, for an emergency operation in the direction of a safe position (for example feathered pitch of the rotor blades), the motor is directly connected to a battery by switching contacts. Thus, for an alternating current, a converter is required to ensure the necessary emergency operation in the direction of a safe position. This concept is used analogously to an increasing extent for direct current drives, because the necessity of switching is thus inapplicable.

The dynamic peak current is provided for a specific time in the converters (depending on the actual value and on the bias), this time being valid without any bias. The current is then reduced to the set continuous current (nominal current). The value and the time duration are predetermined in a fixed manner. Furthermore, the current is monitored by a so-called Ixt calculation.

Where there is a corresponding bias and ongoing current requirement, it can happen that the converter only allows the nominal current. Depending on the load moment, this can mean that the required speed value of the motor concerned is not achieved, right up to the standstill of the drive, which can result in dangerous asymmetries of the rotor blade positions.

If one of the monitoring functions inside the converter detects an error, this leads to inhibiting of the converter which leads to the initiation of an emergency operation via a superordinated monitoring of the rotor blade position. However, for this emergency operation, the operational converter is necessary, so that an error reset is initially carried out. During the emergency operation, the monitoring procedures continue to be active so that there can again be a stopping of the drive, thus entailing dangerous asymmetries of the rotor blade position.

The object of the invention is to develop a blade angle adjustment drive of the type mentioned at the outset such that the rotor blades can reach their safe position as quickly as possible during an emergency operation.

This object is achieved according to the invention by a blade angle adjustment drive according to claim 1 and by a method according to claim 9. Preferred developments of the invention are provided in the subclaims.

The blade angle adjustment drive according to the invention for a wind power plant comprises at least one electrical converter, at least one electric motor which is electrically coupled to the converter and is powered or can be powered by the converter, at least one monitoring unit which monitors the operation of the converter and by which one or a plurality of malfunctions in the operation of the converter are, or can be identified and, subject thereto, the operation of the converter is, or can be, interrupted temporarily or at least temporarily, and at least one activatable additional unit, the activation of which prevents or can prevent an interruption in the operation of the converter by the monitoring unit during an emergency operation.

The activation of the additional unit even allows an interruption-free operation of the converter when the monitoring unit diagnoses an error. Thus, the safe position can be reached relatively quickly during the emergency operation. The at least one monitoring unit preferably continues to operate in the activated state of the additional unit, but can no longer bring about an interruption in the operation of the converter.

The term "emergency operation" is to be understood in particular as meaning that a rotor blade coupled to the electric motor is rotated about its rotor blade axis into a safe position. The wind preferably only exerts small forces on the rotor blade in the safe position. For example, the pitch of the rotor blade in the safe position is zero, so that the safe position is also known as the feathered pitch. All the blades of a rotor of a wind power plant are preferably set in the respectively safe position during an emergency operation. The additional unit is activated in particular during an emergency operation or can be activated during, or together with, an emergency operation.

A plurality of monitoring units which monitor the operation of the converter are preferably provided, by means of which one or a plurality of malfunctions in the operation of the converter are identified and, subject thereto, the operation of the converter is, or can be, disrupted temporarily or at least temporarily. The monitoring units preferably monitor the speed of the electric motor, the output transistors of the converter for overload, the mains supplying the converter for failure, the intermediate circuit voltage at an intermediate circuit of the converter, the supply of the electronics of the converter with electrical energy, the braking resistance for overload, the temperature of cooling bodies provided on the converter, the electric motor for overspeed, the converter for an open output, a program running in the converter, the communication between the converter and one or a plurality of other units (for example the wind turbine control), the temperature of the electric motor and/or an overload of the electric motor. In direct current systems, the field current can also be monitored. Each of these monitoring procedures can be carried out by one of the monitoring units. Thus, the monitoring units can monitor quantities and/or signals which are influenced, or can be influenced by the operation of the blade angle adjustment drive or converter and/or which influence or can influence the operation of the blade angle adjustment drive or converter.

A signal characterising the operation of the blade angle adjustment drive or converter is preferably monitored by the monitoring unit or by each of the monitoring units. In this respect, a valid value or a valid value range is particularly assigned to each of the signals so that an error is always present when one of the signals deviates from the respectively valid value or is outside the respectively valid range of values. When the additional unit is not activated and when an error is detected, the monitoring unit responsible for monitoring the defective signal will or can initiate an interruption in the operation of the converter. However, due to the activation of the additional unit, this interruption is prevented or can be prevented when there is an emergency operation. In particular, due to the activation of the additional unit, an interruption in the operation of the converter by the monitoring units is prevented or can be prevented during an emergency operation.

Preferably, a current monitoring unit monitors the electrical output current released by the converter to the electric motor and, subject thereto, determines the load of the converter. Furthermore, at least one current limiting unit preferably reduces the maximum possible output current to a nominal current in an overloaded state of the converter, which nominal current is smaller than a peak current which the converter provides or can provide as the maximum possible output current in a non-overloaded state. The output current is preferably reduced to the nominal current by the current limiting unit only when the additional unit is not activated. In particular, the activation of the additional unit can prevent the reduction in the output current to the nominal current by the current limiting unit. By the activation of the additional unit, the peak current is preferably permanently provided as the maximum possible output current during an emergency operation, and that is irrespective of the load of the converter at the time of activation. Thus a reduced speed and a standstill of the electric motor can be substantially avoided, so that a fast emergency operation is possible. According to a configuration of the invention, the current monitoring unit is the monitoring unit or one of the monitoring units. The current monitoring unit is preferably inside the converter.

The peak current is in particular greater than the nominal current. The peak current is preferably one and a half times or/up to twice the size of the nominal current.

A speed monitoring unit preferably monitors an actual speed value which represents the speed of the electric motor, a speed sensor being provided to detect said actual speed value. The speed of the electric motor is preferably controlled by means of at least one speed controller, while considering the actual speed value. The actual speed value thus forms a signal which characterises the operation of the blade angle adjustment drive and if said signal is lost, i.e. due to a defective speed sensor, the speed monitoring unit preferably initiates an interruption in the operation of the converter. Thus, the loss of the actual speed value is one of the errors. The speed monitoring unit preferably interrupts the operation of the converter only when the additional unit is not activated. Thus in particular, the activation of the additional unit can prevent the interruption in the operation of the converter by the speed monitoring unit. Furthermore, when the additional unit is in an activated state, the speed controller is preferably transferred into a controlling operating mode (open-loop operation) when the actual speed value is lost, so that the speed of the electric motor is, or can be controlled during an emergency operation. The transfer into open-loop operation is preferably carried out by the speed monitoring unit. According to a configuration of the invention, the speed monitoring unit is the monitoring unit or one of the monitoring units. The speed monitoring unit is preferably inside the converter.

At least one rotor blade is preferably coupled, particularly mechanically coupled, to the electric motor and is, or can be rotated about a rotor blade axis by the electric motor. When performing an emergency operation, the rotor blade is rotated about the rotor blade axis by the electric rotor into the safe position.

According to a development of the invention, an interface monitoring unit monitors an interface of the converter, which interface electrically connects the converter to a control means which is preferably positioned outside the converter. If there is no connection and/or if there is a defective connection between the converter and the control means, an interruption in the operation of the converter is preferably initiated. Thus, the lack of connection and/or defective connection between the converter and the control means is one of the errors. The interface monitoring unit preferably interrupts the operation of the converter only when the additional unit is not activated. Thus in particular, the activation of the additional unit can prevent the interruption in the operation of the converter by the interface monitoring unit. When the additional unit is activated and if there is no connection and/or if there is a defective connection between the converter and the control means, the converter is activated in particular to carry out an emergency operation, so that the rotor blade is, or can be rotated into the safe position. For this, the interface monitoring unit can preferably generate an emergency operation activation signal and supply it to an emergency operation activation input of the converter which thereupon, i.e. in response to the emergency operation activation signal, performs or can perform an emergency operation and rotates or can rotate the rotor blade into the safe position. An interruption in the operation of the converter is preferably not initiated. According to a configuration of the invention, the interface monitoring unit is the monitoring unit or one of the monitoring units. The interface monitoring unit is preferably inside the converter, but can also be configured outside the converter. In the latter case, the interface monitoring unit is preferably integrated into the control means. The emergency operation activation input of the converter can be activated in particular from outside for implementing an emergency operation. For example, the emergency operation activation input of the converter can be controlled by the control means. When the additional unit is activated and if there is an error in the connection between the converter and the control means, the emergency operation activation input of the converter can preferably be controlled, or is controlled, by the interface monitoring unit, in particular to perform the emergency operation.

The monitoring of the connection between the converter and the control means can be carried out, for example in that a test signal is transmitted between the converter and the control means. If the signal is lost, the connection is considered to be defective. When the interface monitoring unit is located inside the converter, the test signal can be generated by the control means, for example, and fed via the interface to the converter in which the interface monitoring unit monitors the incoming test signal. The control means is, for example, the control means of the wind power plant.

The converter preferably has an intermediate circuit in which in particular an electrical capacitor is connected. The intermediate circuit is preferably connected between two power converters of the converter, in particular between a rectifier and a direct current chopper or an inverter of the converter, where the rectifier forms or has in particular an input and the direct current chopper or inverter forms or has in particular an output of the converter. If the electric motor is an a.c. motor, an inverter is preferably used on the output side. However, if the electric motor is a d.c. motor, a direct current chopper is preferably used on the output side. The intermediate circuit is in particular a d.c. intermediate circuit.

An intermediate circuit voltage monitoring unit preferably monitors the intermediate circuit voltage of the converter. If the intermediate circuit voltage is outside a permissible range, an interruption in the operation of the converter is preferably initiated. Thus, the intermediate circuit voltage which is outside the permissible range is one of the errors. The intermediate circuit voltage monitoring unit preferably interrupts the operation of the converter only when the additional unit is not activated. Thus in particular, the activation of the additional unit can prevent the interruption in the operation of the converter by the intermediate circuit voltage monitoring unit. Furthermore, when the additional unit is activated, the intermediate circuit voltage is preferably controlled by a voltage regulator during the emergency operation and thus kept within permissible limits. This preferably also applies in the generator-based operation of the electric motor, for example when the electric motor rotates too quickly. According to a configuration of the invention, the intermediate circuit voltage monitoring unit is the monitoring unit or one of the monitoring units. The intermediate circuit voltage monitoring unit is preferably inside the converter.

The converter preferably comprises a digital computer. According to a configuration of the invention, each of the units, in particular each of the monitoring units and/or the at least one additional unit is completely or partly formed by the, or a, digital computer. Alternatively or in addition thereto, an analogous configuration of one or a plurality of the units is possible.

The invention also relates to a wind power plant comprising a mounting on which a rotor which is driven or can be driven by wind is mounted such that it can rotate about a rotor axis and comprises a rotor hub and a plurality of rotor blades which are each mounted on the rotor hub such that they can rotate about a rotor blade axis, and also comprising a blade angle adjustment system which has per rotor blade a blade angle adjustment drive according to the invention, by which the respective rotor blade can be rotated about its rotor blade axis. In this respect, each rotor blade is preferably coupled, in particular mechanically coupled, to the electric motor of the respective blade angle adjustment drive. Each of the blade angle adjustment drives can be developed according to all configurations described in this connection.

There are preferably at least two or at least three rotor blades. In particular, there are three rotor blades. Each of the rotor blade axes runs in particular transversely or obliquely to the rotor axis.

The invention also relates to a method for controlling a converter of a blade angle adjustment drive of a wind power plant, in which at least one electric motor electrically coupled to the converter is powered by the converter, the operation of the converter is monitored for malfunctions and, in the event of a malfunction, is interrupted temporarily or at least temporarily, and the activation of an additional function of the converter prevents an interruption in the operation of the converter in the event of a malfunction during an emergency operation. The operation of the converter is interrupted in the event of a malfunction in particular only when there is no activation.

The operation of the converter is preferably also monitored for malfunctions during activation. However, in this case, a malfunction does not result in particular in an interruption in the operation of the converter. Malfunctions which occur, however, are preferably logged.

The method according to the invention is preferably carried out using the blade angle adjustment drive of the invention, so that the method can be developed according to all configurations described in this connection.

The electric output current delivered by the converter to the electric motor is preferably monitored and the load of the converter is determined subject thereto. In particular, if the converter is overloaded, the maximum possible output current is reduced to a nominal current which is smaller than a peak current which the converter provides as the maximum possible output current in a non-overloaded state. The output current is preferably reduced to the nominal current only when there is no activation. In particular, the activation prevents the reduction of the output current to the nominal current. The activation preferably permanently provides the peak current as the maximum possible output current during an emergency operation, and that is irrespective of the load of the converter at the time of the activation.

The feature that the peak current is provided as the maximum possible output current does not necessarily mean that in fact the peak current also flows as output current. However, this is possible.

According to a development of the invention, an actual speed value which represents the speed of the electric motor is monitored and the speed of the electric motor is controlled, while considering the actual speed value. If the actual speed value is lost, a control is, however, no longer possible so that an interruption in the operation of the converter is initiated. Thus, the loss of the actual speed value is an error. The operation of the converter is preferably only interrupted when there is no activation. In particular, the activation prevents the interruption in the operation of the converter preferably in that the speed of the electric motor is controlled when the actual speed value is lost. This preferably takes place during an emergency operation.

The electric motor preferably rotates a rotor blade about a rotor blade axis. In the case of an emergency operation, the rotor blade is rotated in particular about the rotor blade axis into the safe position.

According to a configuration of the invention, an electrical connection between the converter and a control means is monitored. If there is no connection and/or if there is a defective connection between the converter and the control means, an interruption in the operation of the converter is initiated. Thus, the lack of connection and/or defective connection between the converter and the control means is an error. The operation of the converter is preferably only interrupted when there is no activation. In particular, the activation prevents the interruption in the operation of the converter. If there is no connection and/or if there is a defective connection between the converter and the control means, the activation activates the converter to carry out an emergency operation so that the rotor blade is rotated into the safe position. For this purpose, an emergency operation activation signal is generated in particular and is supplied to an emergency operation activation input of the converter. Thereupon, i.e. in response to the emergency operation activation signal, the emergency operation is carried out and the rotor blade is rotated into the safe position.

The converter preferably has an intermediate circuit, the voltage of which is monitored during the emergency operation. If the intermediate circuit voltage is outside a permissible range, an interruption in the operation of the converter is initiated. Thus, the intermediate circuit voltage which is outside the permissible range is an error. The operation of the converter is preferably only interrupted when there is no activation. In particular, the activation prevents the interruption in the operation of the converter. The activation preferably controls the intermediate circuit voltage during an emergency operation and thus keeps it within permissible limits. The intermediate circuit is preferably a d.c. intermediate circuit and in particular is connected between a rectifier on the input side and a direct current chopper on the output side or an inverter of the converter. The intermediate circuit preferably comprises an intermediate circuit capacitor.

The additional function can be activated. The additional function can preferably also be deactivated. According to a configuration of the invention, the additional function is provided and/or realised by the additional unit which is realised, for example as an electrical circuit and/or as a program (software). Activation preferably takes place by an activation signal which is supplied in particular to the additional unit, preferably from the, or a control means inside and/or outside the converter, for example the wind turbine control means. The additional unit can be activated by the activation signal and can thus be moved into an activated state. The additional unit is preferably inside the converter and in particular is completely or partly formed by the digital computer.

Thus, according to the invention, an additional function (additional unit) is integrated into the converter and which, upon activation, enables an emergency operation, and that is without the internal monitoring functions of the converter being able to interrupt it. In addition, the current limit for the output current is preferably set at the value of the peak current without a time restriction, so that the electric motor can apply the peak moment. According to a development, if the actual speed value is lost, the drive standstill which usually results therefrom is prevented by an automatic, internal change-over to an open-loop operation. According to a configuration of the invention, during control of the converter, the interface is monitored by a bus interface and when there is no connection, a message is generated for the external activation of an emergency operation.

During the emergency operation, the intermediate circuit voltage is preferably also controlled such that permissible limits are observed even when a generator-based operation of the electric motor takes place, without a disconnection stopping the drive and without this leading to the destruction of the converter.

The activatable additional function is activated particularly in emergency situations so that it is possible to prevent any danger to the wind power plant. Since activation of the additional function (additional unit) can damage the converter, the activation of the additional function is preferably recorded, which can be performed, for example in a logbook inside the converter, so that activations of the additional function can be retraced.

The permanent provision of the peak current in the activated state also means that the electric motor can apply sufficient torque to overcome possible sluggishness, in spite of a bias of the converter. Thus, it is basically possible to prevent a standstill of the drive. Furthermore, a drive which has already been inhibited can be started up again if, due to the provision of the peak current by the electric motor, a torque can be applied which is greater than the initial breakaway torque of the existing blockade.

The suppression of interruptions in the converter operation in the event of malfunction and the integration of additional functions, for example the change-over to open-loop operation as well as the control of the intermediate circuit voltage mean that the drive according to the invention can be used with great availability, if the malfunctions which occur still enable the converter to function.

In the following, the invention will be described on the basis of a preferred embodiment with reference to the drawings, in which.

Figure 1:
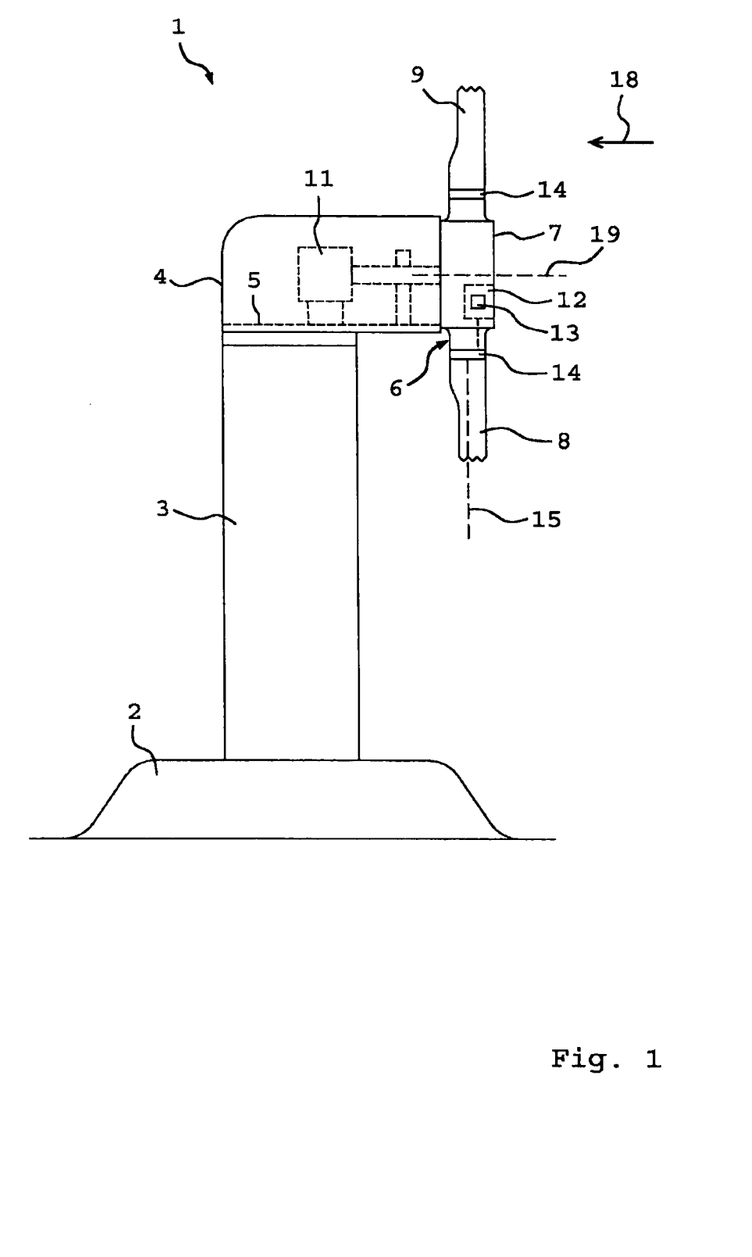
FIG. 1 is a schematic view of a wind power plant.

FIG. 1 is a schematic view of a wind power plant 1 which comprises a tower 3 which stands on a foundation 2 and on the end of which remote from the foundation 2 is positioned a power house 4. The power house 4 has a mounting (support) 5 on which a rotor 6 is rotatably mounted which comprises a rotor hub 7 and a plurality of rotor blades 8, 9 and 10 connected to said rotor hub 7 (see also FIG. 5). The rotor is mechanically coupled to an electrical generator 11 which is arranged in the power house 4 and attached to the support 5.

Figure 5:
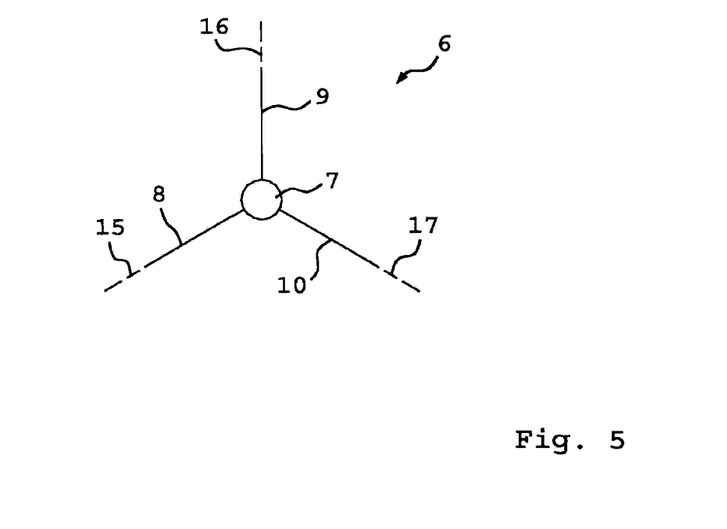
FIG. 5 is a schematic plan view of the rotor of the wind turbine.

Arranged in the rotor 6 is a blade angle adjustment system with blade angle adjustment drives 14 which are according to an embodiment of the invention and comprise converters 13, by which drives 14 the rotor blades 8, 9 and 10 can be rotated about their respective longitudinal axis (rotor blade axis) 15, 16 and 17 relative to the rotor hub (see also FIG. 5). One of the blade angle adjustment drives 14 is preferably associated with each of the rotor blades. The rotor 6 is rotated about a rotor axis 19 by the force of wind 18.

FIG. 5 is a schematic plan view of the rotor 6, and thus shows the three rotor blades 8, 9 and 10.

Figure 2:
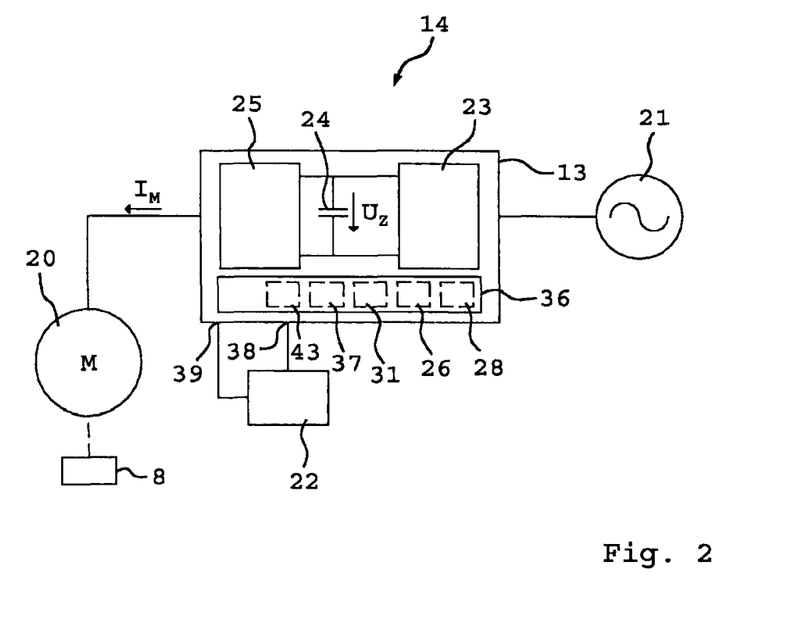
FIG. 2 shows a schematic block diagram of a blade angle adjustment drive.

FIG. 2 shows a schematic block diagram of one of the blade angle adjustment drives 14 of the rotor blade adjustment system 12, an electric motor 20 configured here as a d.c. motor being electrically coupled to one of the converters 13 which is connected to an electrical power supply 21 and is powered thereby. Furthermore, the converter 13 is connected to a control means 22 which controls the converter 13. The converter 13 comprises a rectifier 23, an intermediate circuit with capacitor 24 and a direct current chopper 25. The motor 20 is mechanically coupled to the rotor blade 8 which can be rotated about the rotor blade axis 15 by the motor 20.

Figure 3:
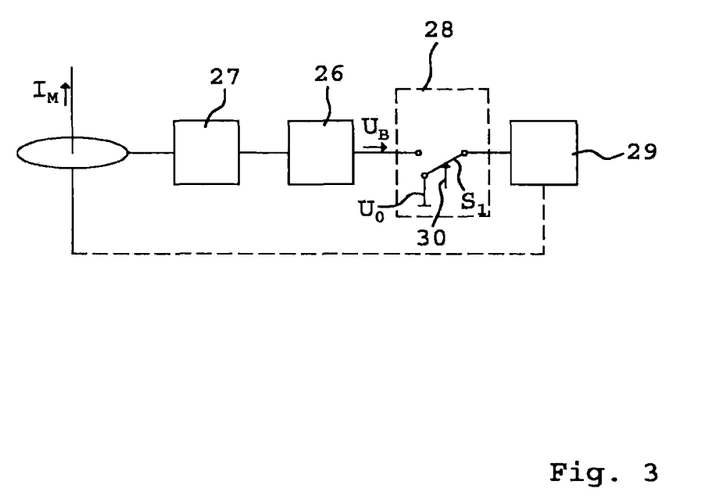
FIG. 3 shows a schematic block diagram of a current monitoring system.

As can be seen from FIG. 3, the converter 13 comprises a current monitoring unit 26 which detects the motor current (output current) IM by means of an ammeter 27 and, subject thereto, generates a load signal UB characterising the load of the converter 13, which load signal is, or can be, supplied to a current limiting unit 29, with the interconnection of an additional unit 28. The current limiting unit 29 limits the motor current IM to a peak current IS as long as the load signal UB is below a threshold US. If the load signal UB reaches or exceeds the threshold US, the current limiting unit 29 reduces the motor current IM to a nominal current IN which is smaller than the peak current IS. The nominal current IN is preferably half the peak current IS.

In FIG. 3, only part of the additional unit 28 is shown, and it comprises a switch S1 which can be changed over by a switching signal 30. The switch S1 is formed, for example by a transistor or a relay. In the illustrated state which corresponds to an activated state of the additional unit 28, it is not the load signal UB which is switched to the current limiting unit 29, but a signal U0 which characterises an unloaded state of the converter 13 and thus it does not reach or exceed the threshold US. However, the switching signal 30 can change the switch S1 over into a second position, in which the current limiting unit 29 is supplied with the load signal UB, which is the case in a deactivated state of the additional unit 28. In the activated state of the additional unit 28, an overloaded state of the converter 13 never arises for the current limiting unit 29, so that the peak current IS is constantly provided as the output current IM.

Figure 4:
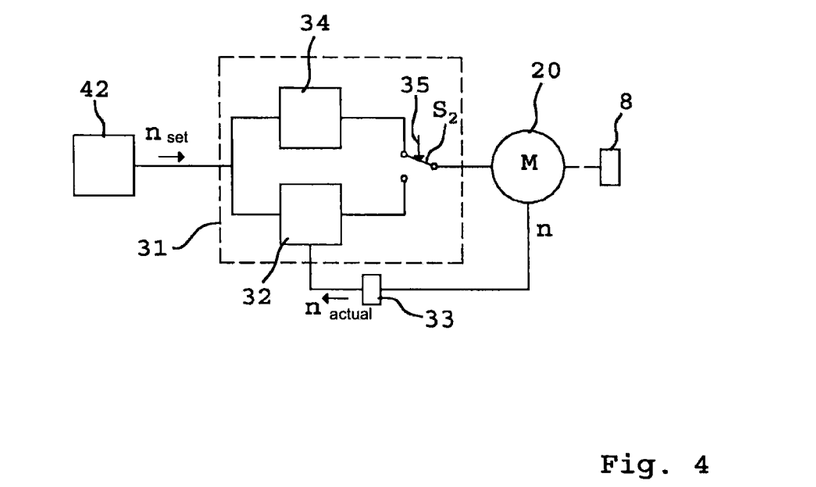
FIG. 4 shows a schematic block diagram of a speed monitoring system.

FIG. 4 shows a schematic block diagram of a speed monitoring system, comprising a speed controller 31 for controlling the speed n of the electric motor 20, which speed is detected by a speed sensor 33 and is supplied to the speed controller 31 as an actual speed value $n_{actual}$. Furthermore, a set speed value $n_{set}$ is supplied by a set point generator 42 to the speed controller 31. If the actual speed value $n_{actual}$ is not available, it is possible to switch over to a controlled operation of the speed controller 31 which comprises for this purpose a speed control unit 34 and a switch S2 which can be actuated by a switching signal 35. The switch S2 is formed, for example by a transistor or a relay. A speed regulating unit 32 which forms the actual controller is also shown schematically. In the illustrated position of switch S2, the speed controller 31 is switched into controlled operation which is possible without an actual speed value. However, by changing switch S2 over by means of the switching signal 35, the motor 20 is switched into a controlled operation which is impossible without the actual speed value.

In FIGS. 3 and 4, the units 26, 28 and 31 are only shown schematically and are realised numerically by means of a digital computer 36, integrated into the converter 13. The same applies accordingly to a voltage regulator 37, by which, in an activated state of the additional unit 28, the intermediate circuit voltage UZ can be controlled and can thus be kept within predetermined limits. Furthermore, an interface 38 of the converter 13, by which the control means 22 is connected to the converter 13, is monitored. If there is a defective connection between the control means 22 and the converter 13 via the interface 38, an emergency operation is initiated via an emergency operation activation input 39 of the converter 13, in that an interface monitoring unit 43 realised by the computer 36 or the control means 22 generates a suitable emergency operation activation signal and supplies it to the emergency operation activation input 39.

During an emergency operation, the additional unit 28 is preferably constantly activated, and that is irrespective of whether the emergency operation is initiated externally, for example via the interface 38 or via the input 39, or is initiated internally, for example by one of the units or by the digital computer 36.

Figure 6:
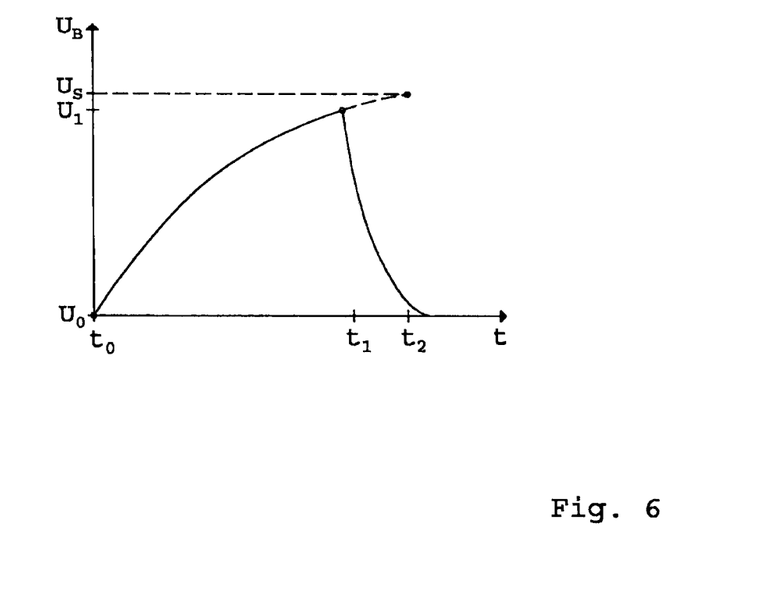
FIG. 6 shows a schematic course of the load signal.
Figure 7:
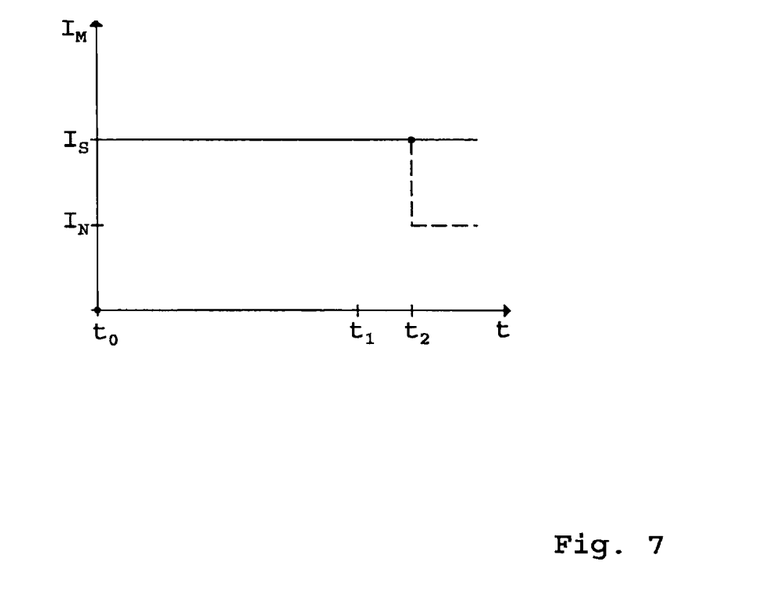
FIG. 7 shows a schematic course of the motor current.

In FIG. 6, a course of the load signal UB over time t is plotted schematically, where U0 characterises the unloaded state of the converter 13 at time t0. In this case, the maximum possible peak current IS flows permanently as the motor current IM, so that the load signal UB steadily increases. At a time t1, the switch S1 is closed and the load signal UB is reset to the unloaded state U0. The peak current IS thus continues to flow, which can be seen in FIG. 7, in which a course of the motor current IM is plotted over time t. At switching time t1, the voltage UB has a value U1 which characterises a loaded state of the converter 13. The value U1 is between the value U0 for the unloaded state and the value US which characterises the overloaded state of the converter 13. FIG. 6 shows the threshold voltage US which characterises the overloaded state of the converter 13.

In the following, it will be assumed that the switch S1 is not closed at time t1, so that with the peak current IS still flowing, the voltage UB reaches the threshold US at a time t2 (shown in dashed lines in FIG. 6), which results in an immediate reduction in the output current IM to a nominal current IN (shown in dashed lines in FIG. 7), which is smaller than the peak current IS. The current limiting unit 29 reduces the motor current IM to the nominal current IN.

Figure 8:
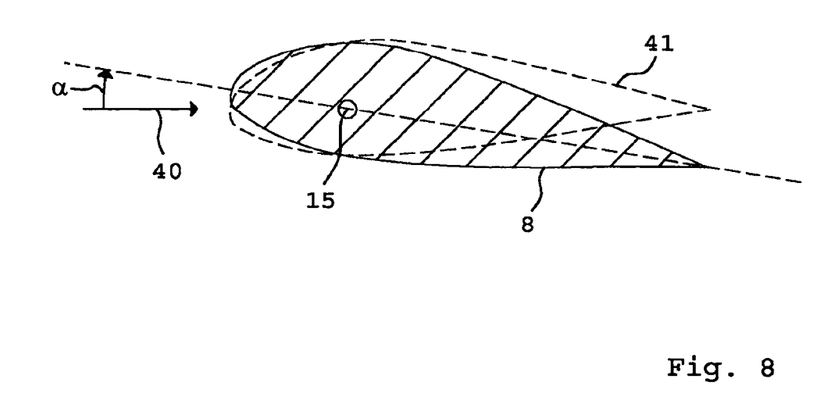
FIG. 8 is a schematic side view of a rotor blade.

FIG. 8 is a schematic cross-sectional view through the rotor blade 8, where a denotes the pitch of the rotor blade 8 to an onflow direction 40 of the air (wind). By rotating the rotor blade 8 about the rotor blade axis 15, the rotor blade 8 can be set in different positions, the view 41 in dashed lines illustrating the rotor blade 8 set in the safe position.

Figure 9:
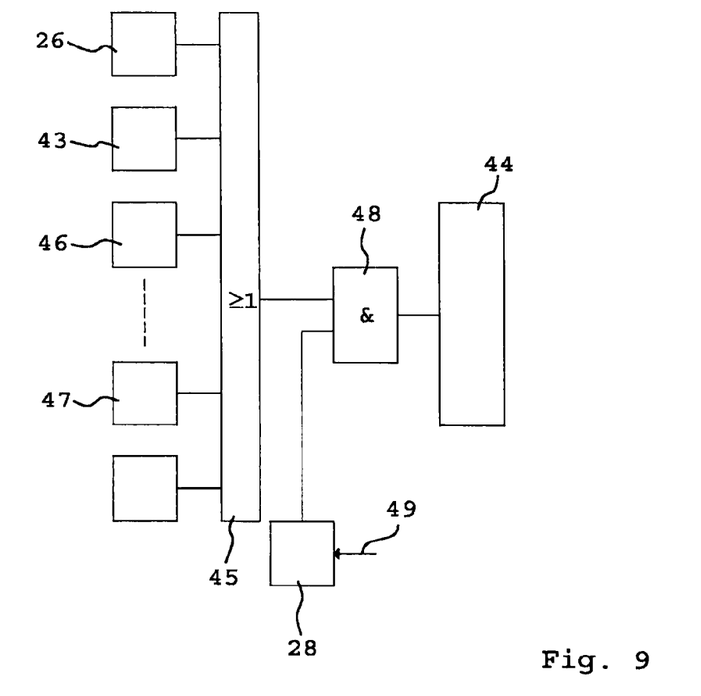
FIG. 9 is a schematic view of a plurality of units.

FIG. 9 schematically shows a plurality of monitoring units 26, 43, 46, 47 and the additional unit 28 which, in the activated state, prevents an interruption in the operation of the converter 13 by the monitoring units. An interruption activation unit 44 is also shown, the activation of which causes an interruption of the converter 13. The outputs of the monitoring units provided for the activation of the interruption activation unit 44 are connected to the inputs of a logical unit 45 which realises a logical OR-operation of its inputs and provides the result of this logic operation as an output signal. Connected between the output of the logical unit 45 and the interruption activation unit 44 is a logical unit 48, the output of logical unit 45 being connected to one input of logical unit 48 and the additional unit 28 being connected to the other input of logical unit 48. The logical unit 48 realises a logical AND-operation of both of its inputs and delivers the result of this logic operation as an output signal to the interruption activation unit 44. In the activated state, the additional unit 28 constantly releases a logical low level to the logical unit 48, so that an activation of the interruption activation unit 44 is prevented, irrespective of the output signal of the monitoring units. In this case, the logical unit 48 namely constantly releases a logical low level to the interruption activation unit 44, the activation of which requires a logical high level.

However, in the deactivated state, the additional unit 28 constantly releases a logical high level to the logical unit 48, so that an activation of the interruption activation unit 44 is possible by any of the monitoring units, in that one or a plurality of the monitoring units deliver as the output signal a logical high level to the logical unit 45 which then delivers a high level to the logical unit 48. Thus, the logical unit 48 delivers a logical high level to the interruption activation unit 44, which is then activated and brings about an interruption of the converter 13. The additional unit 28 can be activated and deactivated by an activation signal 49.

FIG. 9 schematically shows a speed monitoring unit 46 and an intermediate circuit voltage monitoring unit 47. The speed monitoring unit 46 monitors the actual speed value $n_{actual}$ of the electric motor 20 and, if this value is lost, initiates an interruption in the operation of the converter 13, if the additional unit 28 is deactivated. Furthermore, the intermediate circuit voltage monitoring unit 47 monitors the intermediate circuit voltage UZ and initiates an interruption in the operation of the converter 13 if the intermediate circuit voltage is outside a permissible range and if the additional unit 28 is deactivated.

The mode of operation of the additional unit 28 and its cooperation with the other units, described with reference to FIG. 9, is to be understood merely as an example and can also be realised in a different manner. The additional unit 28 and its cooperation with the other units is preferably realised completely or in part by the computer 36 in a numerical manner. The other units are preferably also realised completely or in part by the computer 36 in a numerical manner.

The invention claimed is:

1. A blade angle adjustment drive for a wind power plant, comprising:
    an electrical converter;
    an electric motor electrically coupled to and powered by the converter;
    a monitoring unit for monitoring the operation of the converter to identify a malfunction in the operation of the converter, and for selectively interrupting the operation of the converter based on the malfunction; and
    an interruption prevention unit selectively operable to modify and limit control operations performed by the monitoring unit to prevent the monitoring unit from causing an interruption in the operation of the converter when the blade angle adjustment drive is in an emergency operation state, the interruption prevent unit configured to block a first signal indicative of a load being experienced by the electrical converter, and to supply in place of the first signal a second signal which characterizes an unloaded state of the electrical converter.

2. The blade angle adjustment drive according to claim 1, further comprising:
    a current monitoring unit for monitor an output current of the converter to the electric motor; and
    a current limiting unit for receiving the first and second signals and which, when the converter is in an overloaded state, determines the load of the converter and reduces the maximum possible output current to a nominal value that is less than a peak value which the converter provides as the maximum possible output current in a non-overloaded state;
    wherein the second signal provided by the interruption prevention unit provides the peak current as the maximum possible output current when the blade angle adjustment drive is in the emergency operation state, regardless of the load of the converter at the time of activation.

3. The blade angle adjustment drive according to claim 1, further comprising:
    a speed monitoring unit for monitoring an actual speed value which represents the speed of the electric motor; and
    a speed controller for controlling the speed of the electric motor based on the actual speed value;
    wherein the interruption prevention unit is activated when the blade angle adjustment drive is in the emergency operation state; and
    wherein the speed controller switches to an open-loop mode of operation when the interruption prevention unit is activated and the actual speed value is lost so that the speed of the electric motor is controlled in the emergency operation state.

4. The blade angle adjustment drive according to claim 3, further comprising at least one rotor blade which is rotated about a rotor blade axis into a safe position by the blade angle adjustment drive when the blade angle adjustment drive is operating in the emergency operation state.

5. The blade angle adjustment drive according to claim 4, wherein the converter comprises an intermediate circuit operably coupled between a rectifier and at least one of a direct current chopper and an inverter at which there is an intermediate circuit voltage, and wherein the activation of the interruption prevention unit prevents interruption in the control of the intermediate circuit voltage of the converter when the blade angle adjustment drive is in the emergency operation state.

6. The blade angle adjustment drive according to claim 1, further comprising at least one rotor blade which is coupled to the electric motor and is operable to rotate about a rotor blade axis.

7. The blade angle adjustment drive according to claim 6, further comprising an interface monitoring unit configured for monitoring an interface of the converter, wherein the interface of the converter is electrically connected to a controller, and wherein the converter activates to perform the emergency operation state and the rotor blade rotates into a safe position when there is a defective connection between the converter and the controller.

8. The blade angle adjustment drive according to claim 1, wherein at least one of said monitoring unit and said interruption prevention unit comprises a digital controller.

9. A method for controlling a converter of a blade angle adjustment drive of a wind power plant, comprising:
operating a converter which provides power to an electric motor electrically coupled to the converter;
using a monitoring unit to monitor monitoring the converter for a malfunction; and
selectively activating an interruption prevention unit to modify and limit control operations performed by the monitoring unit; and
when the interruption prevention unit is selectively activated, using the interruption prevention unit during a detected malfunction of the converter to prevent the monitoring unit from interrupting operation of the converter when a malfunction of the converter is detected, and when the blade angle adjustment drive is operating in an emergency operation state, the interruption prevent unit operating to block a first signal which is indicative of a load being experienced by the electrical converter, and to supply in place of the first signal a second signal which characterizes an unloaded state of the electrical converter.

10. The method according to claim 9, further comprising:
delivering an electrical output current of the converter to the electric motor;
monitoring the electrical output current;
determining the load of the converter;
reducing a maximum possible output current, when in an overloaded state of the converter, to a nominal current which is smaller than a peak current which the converter provides as the maximum possible output current in a non-overloaded state; and
using the second signal to permanently provide the peak current irrespective of the load of the converter upon activation of the interruption prevention unit when the interruption prevention unit is active and the blade angle adjustment drive is in the emergency operation state.

11. The method according to claim 9, further comprising:
open-loop controlling and monitoring the speed of the electric motor based on an actual speed value; and
controlling the speed of the electric motor upon activation of the interruption prevention unit when the actual speed value is lost.

12. The method according to claim 9, further comprising rotating a rotor blade about a rotor blade axis.

13. The method according to claim 12, further comprising rotating the rotor blade into a safe position when the blade angle adjustment drive is in the emergency operation state.

14. The method according to claim 13, further comprising:
monitoring an electrical connection between the converter and a controller; and
activating the converter to perform in the emergency operation state so that the rotor blade is rotated into the safe position when there is a defective connection between the converter and the controller and the interruption prevention unit is active.

15. The method according to claim 13, further comprising controlling the intermediate circuit voltage of the converter upon activation of the interruption prevention unit and when the blade angle adjustment drive is in the emergency operation state.

16. The blade angle adjustment drive according to claim 3 wherein the converter comprises a speed monitoring unit.

* * * * *